(12) United States Patent
Billingsley et al.

(10) Patent No.: US 12,426,261 B2
(45) Date of Patent: Sep. 23, 2025

(54) INTEGRATED CIRCUITRY COMPRISING A MEMORY ARRAY COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Daniel Billingsley, Meridian, ID (US); Jordan D. Greenlee, Boise, ID (US); John D. Hopkins, Meridian, ID (US); Yongjun Jeff Hu, Boise, ID (US); Swapnil Lengade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 485 days.

(21) Appl. No.: 18/076,702

(22) Filed: Dec. 7, 2022

(65) Prior Publication Data
US 2023/0099418 A1 Mar. 30, 2023

Related U.S. Application Data

(62) Division of application No. 17/068,470, filed on Oct. 12, 2020, now Pat. No. 11,552,090.
(Continued)

(51) Int. Cl.
*H10B 41/27* (2023.01)
*G11C 16/04* (2006.01)
(Continued)

(52) U.S. Cl.
CPC ......... *H10B 41/27* (2023.02); *G11C 16/0483* (2013.01); *H10B 41/10* (2023.02);
(Continued)

(58) Field of Classification Search
CPC ................................ H10B 43/27; H10B 43/20
See application file for complete search history.

(56) References Cited

U.S. PATENT DOCUMENTS

| 6,285,542 B1 | 9/2001 | Kennedy, III et al. |
| 9,343,358 B1 | 5/2016 | Xu |

(Continued)

FOREIGN PATENT DOCUMENTS

KR  10-2020-0018713  2/2020

*Primary Examiner* — Christopher A Johnson
(74) *Attorney, Agent, or Firm* — Wells St. John P.S.

(57) ABSTRACT

A method used in forming a memory array comprising strings of memory cells comprises forming an upper stack directly above a lower stack. The lower stack comprises vertically-alternating lower-first-tiers and lower-second-tiers. The upper stack comprises vertically-alternating upper-first-tiers and upper-second-tiers. Lower channel openings extend through the lower-first-tiers and the lower-second-tiers. The lower channel openings have sacrificial material therein. An upper of the lower-second-tiers or a lower of the upper-second-tiers comprises non-stoichiometric silicon dioxide that has a silicon-to-oxygen atomic ratio greater than 0.5. A higher of the upper-second-tiers that is above said lower upper-second-tier comprises silicon dioxide that has a silicon-to-oxygen atomic ratio less than or equal to 0.5. Upper channel openings are etched through the upper-first-tiers and the upper-second-tiers to stop on said upper lower-second-tier or said lower upper-second-tier. After the stop, the sacrificial material is removed from the lower channel openings and channel-material strings are formed in the upper and lower channel openings. Other embodiments, including structure independent of method, are disclosed.

18 Claims, 14 Drawing Sheets

Related U.S. Application Data

(60) Provisional application No. 63/071,563, filed on Aug. 28, 2020.

(51) Int. Cl.
  *H10B 41/10*  (2023.01)
  *H10B 41/35*  (2023.01)
  *H10B 43/10*  (2023.01)
  *H10B 43/27*  (2023.01)
  *H10B 43/35*  (2023.01)

(52) U.S. Cl.
  CPC .............. *H10B 41/35* (2023.02); *H10B 43/10* (2023.02); *H10B 43/27* (2023.02); *H10B 43/35* (2023.02)

(56) References Cited

U.S. PATENT DOCUMENTS

| | | |
|---|---|---|
| 9,589,839 B1 | 3/2017 | Ikawa et al. |
| 10,283,520 B2 | 5/2019 | Hopkins et al. |
| 10,446,578 B1 | 10/2019 | Howder et al. |
| 10,861,902 B2 | 12/2020 | Lee et al. |
| 10,910,392 B2 | 2/2021 | Mori et al. |
| 10,916,556 B1 | 2/2021 | Sakakibara et al. |
| 2004/0063001 A1 | 4/2004 | Wu et al. |
| 2010/0109065 A1 | 5/2010 | Oh et al. |
| 2010/0109072 A1 | 5/2010 | Kidoh et al. |
| 2011/0233646 A1 | 9/2011 | Mizushima et al. |
| 2011/0287612 A1 | 11/2011 | Lee et al. |
| 2015/0236038 A1 | 8/2015 | Pachamuthu et al. |
| 2017/0062454 A1 | 3/2017 | Lu et al. |
| 2017/0179026 A1 | 6/2017 | Toyama et al. |
| 2018/0308858 A1 | 10/2018 | Hopkins et al. |
| 2018/0331117 A1 | 11/2018 | Titus et al. |
| 2019/0013404 A1 | 1/2019 | Carlson et al. |
| 2019/0081061 A1* | 3/2019 | Tessariol ............ H01L 21/76877 |
| 2020/0066747 A1 | 2/2020 | Howder et al. |
| 2020/0083059 A1 | 3/2020 | Hopkins et al. |
| 2020/0168619 A1 | 5/2020 | Zhou et al. |
| 2020/0194446 A1 | 6/2020 | Nishida et al. |
| 2020/0350326 A1 | 11/2020 | Yun et al. |
| 2020/0388626 A1 | 12/2020 | Baraskar et al. |
| 2020/0388688 A1 | 12/2020 | Baraskar et al. |
| 2021/0028061 A1 | 1/2021 | Farooq et al. |
| 2021/0183641 A1 | 6/2021 | Wang et al. |
| 2021/0384209 A1 | 12/2021 | Heo |
| 2021/0391289 A1 | 12/2021 | Kim et al. |
| 2022/0020763 A1 | 1/2022 | Billingsley et al. |
| 2022/0068945 A1 | 3/2022 | Billingsley et al. |
| 2022/0068959 A1 | 3/2022 | Billingsley et al. |

* cited by examiner

INTEGRATED CIRCUITRY COMPRISING A MEMORY ARRAY COMPRISING STRINGS OF MEMORY CELLS AND METHODS USED IN FORMING A MEMORY ARRAY COMPRISING STRINGS OF MEMORY CELLS

RELATED PATENT DATA

This patent resulted from a divisional application of U.S. patent application Ser. No. 17/068,470, filed Oct. 12, 2020, entitled "Integrated Circuitry Comprising A Memory Array Comprising Strings Of Memory Cells And Methods Used In Forming A Memory Array Comprising Strings Of Memory Cells", naming Daniel Billingsley, Jordan D. Greenlee, John D. Hopkins, Yongjun Jeff Hu, and Swapnil Lengade as inventors, which claims priority to U.S. Provisional Patent Application Ser. No. 63/071,563, filed Aug. 28, 2020, entitled "Integrated Circuitry Comprising A Memory Array Comprising Strings Of Memory Cells And Methods Used In Forming A Memory Array Comprising Strings Of Memory Cells", naming Daniel Billingsley, Jordan D. Greenlee, John D. Hopkins, Yongjun Jeff Hu, and Swapnil Lengade as inventors, the disclosures of which are incorporated by reference.

TECHNICAL FIELD

Embodiments disclosed herein pertain to integrated circuitry comprising a memory array comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array).

Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-26 which may be considered as a "gate-last" or "replacement-gate" process, and starting with FIGS. 1-3.

Figure 1:
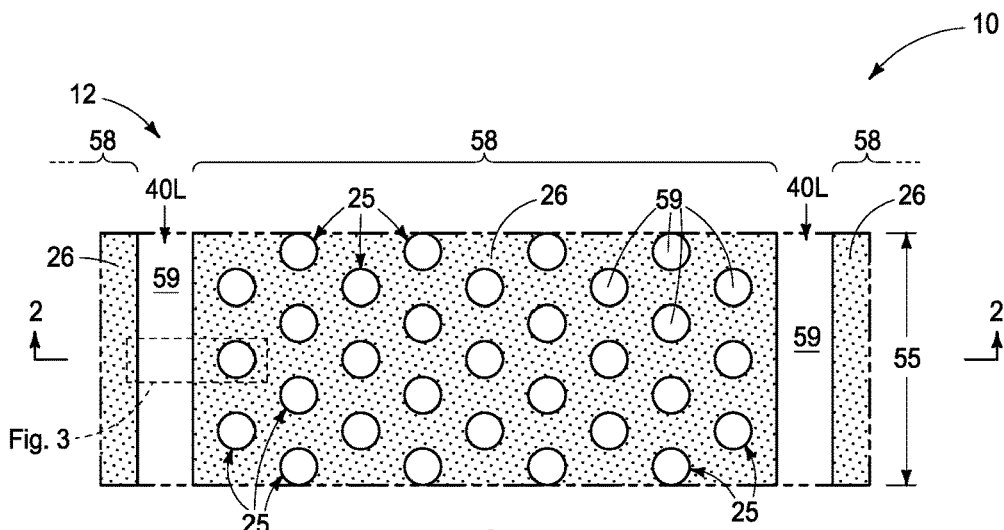
FIG. 1 is a diagrammatic cross-sectional view of a portion of a substrate in process in accordance with an embodiment of the invention and is taken through line 1-1 in FIG. 2.
Figure 2:
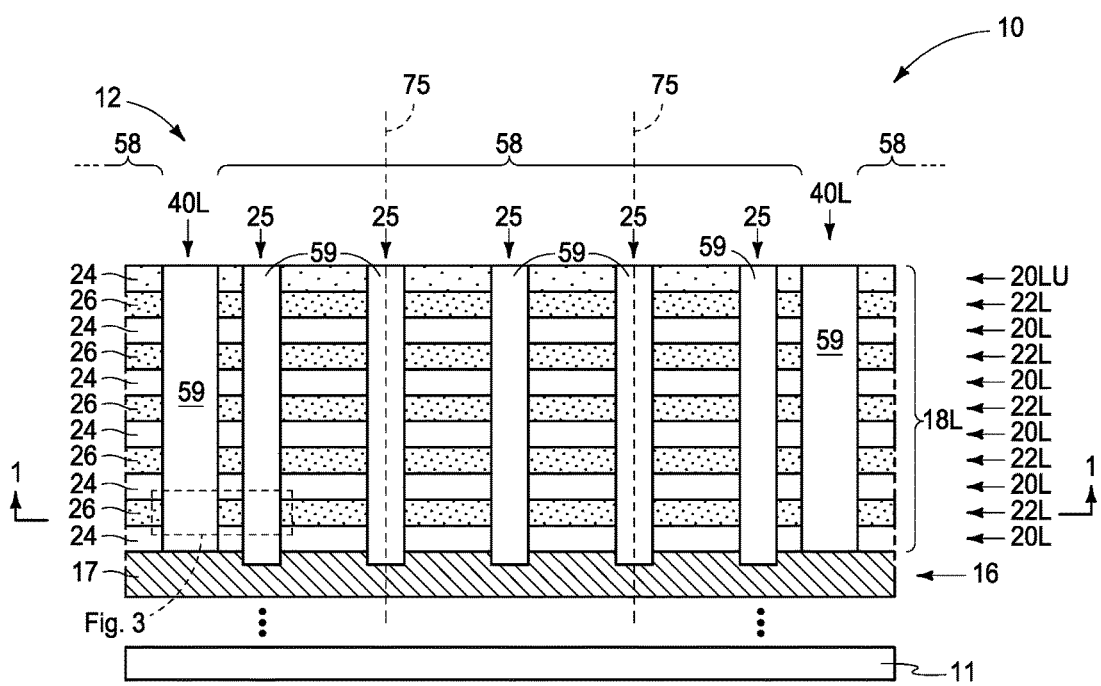
FIG. 2 is a diagrammatic cross-sectional view taken through line 2-2 in FIG. 1.
Figure 3:
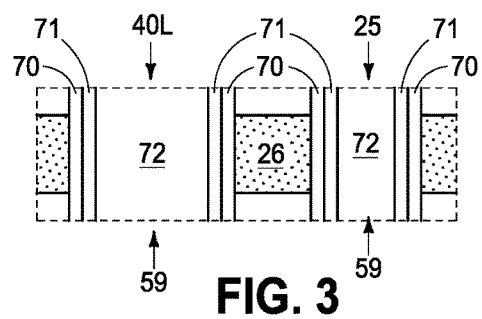
FIG. 3 is an enlarged view of a portion of FIGS. 1 and 2.

FIGS. 1-3 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., conductively-doped polysilicon atop WSix) has been formed above substrate 11. Conductor tier 16 may comprise part of control circuitry (e.g., peripheral-under-array circuitry and/or a common source line or plate) used to control read and write access to the transistors and/or memory cells that will be formed within array 12.

A lower stack 18L comprising vertically-alternating lower-insulative-tiers 20L* and lower-conductive-tiers 22L* has been formed above conductor tier 16 (an * being used as a suffix to be inclusive of all such same-numerically-designated components that may or may not have other suffixes). Example thickness for each of lower tiers 20L* and 22L* is 22 to 60 nanometers. Only a small number of lower tiers 20L* and 22L* is shown, with more likely lower stack 18L comprising dozens, a hundred or more, etc. of lower tiers 20L* and 22L*. Other circuitry that may or may not be part of peripheral and/or control circuitry may be between conductor tier 16 and lower stack 18L. For example, multiple vertically-alternating tiers of conductive material and insulative material of such circuitry may be below a lowest of lower-conductive-tiers 22L* and/or above an uppermost of lower-conductive-tiers 22L*. For example, one or more select gate tiers (not shown) or dummy tiers (not shown) may be between conductor tier 16 and the lowest conductive tier 22L* and one or more select gate tiers (not shown) or dummy tiers (not shown) may be above an uppermost of lower-conductive-tiers 22L*. Alternately or additionally, at least one of the depicted lowest conductive tiers 22L* may be a select gate tier. Regardless, lower-conductive-tiers 22L* (alternately referred to as lower-first-tiers) may not comprise conducting material and lower-insulative-tiers 20L* (alternately referred to as lower-second-tiers) may not comprise insulative material at this point in processing in conjunction with the hereby initially-described example method embodiment which is "gate-last" or "replacement-gate". Example lower-conductive-tiers 22L* comprise first material 26 (e.g., silicon nitride) which may be wholly or partially sacrificial. Example lower-insulative-tiers 20L* comprise second material 24 (e.g., that comprises silicon dioxide as further explained below) that is of different composition from that of first material 26 and which may be wholly or partially sacrificial. For purposes of the continuing discussion, lower-first-tiers 22L* may be considered as comprising an upper lower-first-tier 22LU which in one embodiment as shown is the uppermost of lower-first-tiers 22L*. Lower stack 18L may have an uppermost tier that is either a lower-first-tier 22L* or a lower-second-tier 20L*.

Lower channel openings 25 have been formed (e.g., by etching) through lower-insulative-tiers 20L* and lower-conductive-tiers 22L* to conductor tier 16. Lower channel openings 25 may taper radially-inward (not shown) moving deeper into lower stack 18L. In some embodiments, lower channel openings 25 may go into conductor material 17 of conductor tier 16 as shown or may stop there-atop (not shown). Alternately, as an example, lower channel openings 25 may stop atop or within the lowest lower-insulative-tier 20L*. A reason for extending lower channel openings 25 at least to into conductor material 17 of conductor tier 16 is to provide an anchoring effect to material that is within lower channel openings 25. Etch-stop material (not shown) may be within or atop conductor material 17 of conductor tier 16 to facilitate stopping of the etching of lower channel openings 25 relative to conductor tier 16 when such is desired. Such etch-stop material may be sacrificial or non-sacrificial. Regardless, lower channel openings 25 may be considered as having an average longitudinal axis 75 (e.g., average if axis 75 is not perfectly straight) that in one embodiment is vertical.

Horizontally-elongated lower trenches 40L have been formed (e.g., by anisotropic etching) into lower stack 18L to form laterally-spaced memory-block regions 58. By way of example and for brevity only, lower channel openings 25 are shown as being arranged in groups or columns of staggered rows of four and five lower channel openings 25 per row and being arrayed in laterally-spaced memory-block regions 58 that will comprise laterally-spaced memory blocks 58 in a finished circuitry construction. In this document, "block" is generic to include "sub-block". Lower trenches 40L will typically be wider than lower channel openings 25 (e.g., 10 to 20 times wider, yet such wider degree not being shown for brevity). Memory-block regions 58 and resultant memory blocks 58 (not yet shown) may be considered as being longitudinally elongated and oriented, for example along a direction 55. Any alternate existing or future-developed arrangement and construction may be used.

Sacrificial material 59 has been formed in lower channel openings 25 in lower-first-tiers 22L* and in lower-second-tiers 20L*. In one embodiment and as shown, sacrificial material 59 has been formed in lower trenches 40L. In one embodiment, sacrificial material 59 in lower channel openings 25 comprises a radially-outer silicon dioxide 70, a radially-inner silicon dioxide 72, and aluminum oxide 71 radially there-between. Lower trenches 40L may comprise corresponding aluminum oxide 71 and silicon dioxide 70, 72. Materials 70, 71, and 72 are only so designated in FIG. 3 for clarity in other figures. In one embodiment, radially-outer silicon dioxide 70 and radially-inner silicon dioxide 72 are of different composition relative one another, and in one such embodiment the different composition is characterized by concentration of at least one of boron and phosphorus. As but one specific example, radially-inner silicon dioxide 72 is BPSG and radially-outer silicon dioxide 70 is undoped silicon dioxide.

Figure 4:
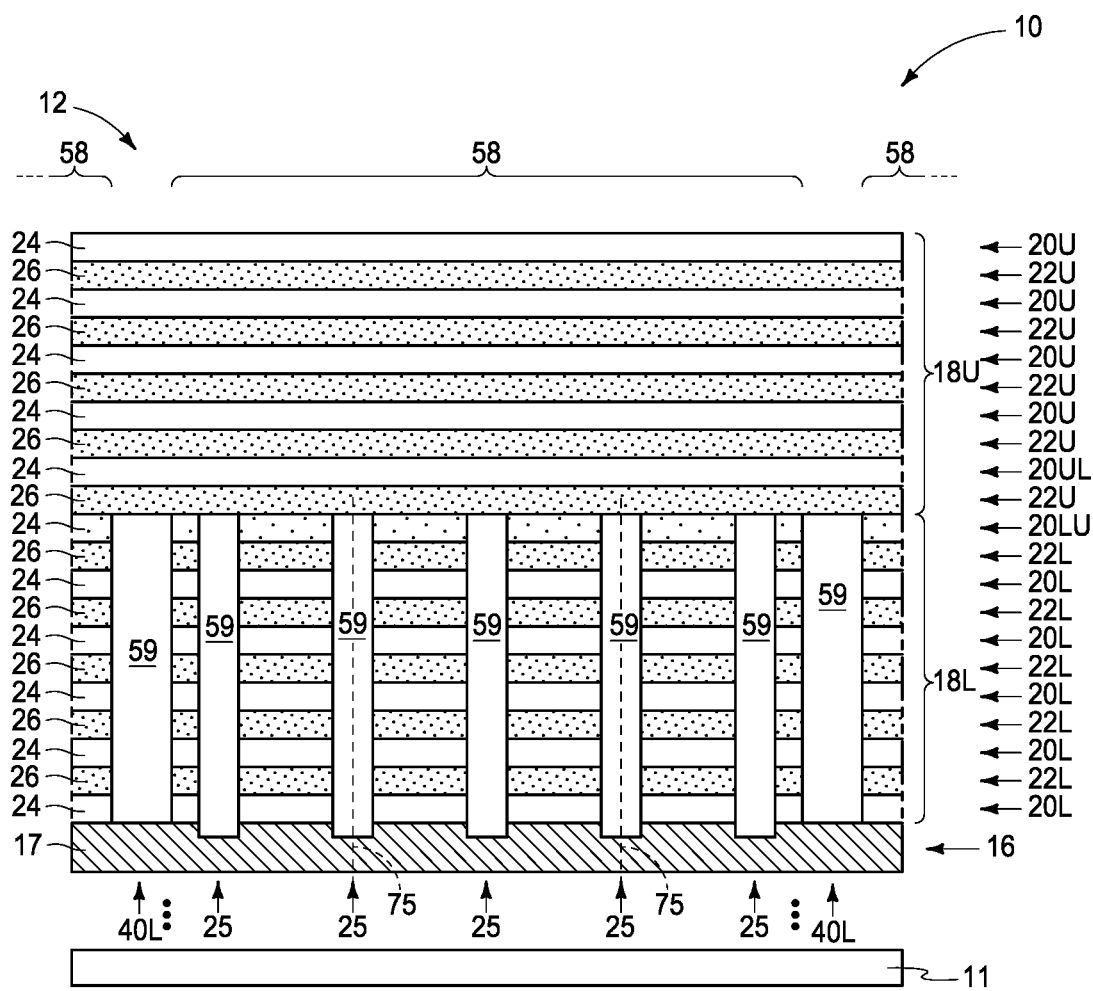
FIGS. 4-7 and 10-26 are diagrammatic sequential sectional, expanded, enlarged, and/or partial views of the construction of FIGS. 1-3, or portions thereof, in process in accordance with some embodiments of the invention.

Referring to FIG. 4, an upper stack 18U comprising vertically-alternating upper-insulative-tiers 20U* (alternately referred to as upper-second-tiers) and upper-conductive-tiers 22U* (alternately referred to as upper-first-tiers) has been formed above lower stack 18L. Upper-insulative-tiers 20U* and upper-conductive-tiers 22U* may have any of the attributes described above with respect to lower-insulative-tiers 20L* and lower-conductive-tiers 22L*. Example upper-conductive-tiers 22U* comprise first material 26 (e.g., silicon nitride) which may be wholly or partially sacrificial. Example upper-insulative-tiers 20U* are shown as comprising second material 24 and upper-conductive-tiers 22U* are shown as comprising first material 26, although other compositions may of course be used and not necessarily of the same composition as in lower stack 18L. For purposes of the continuing discussion, upper-first-tiers 22U* may be considered as comprising a lower upper-first-tier 22UL which in one embodiment as shown is the lowest of upper-first-tiers 22U*. Upper stack 18U may have an uppermost tier that is either an upper-first-tier 22U* or an upper-second-tier 20U*.

An upper of lower-second-tiers 20L* or a lower of upper-second-tiers 20U* comprises non-stoichiometric silicon dioxide having a silicon-to-oxygen atomic ratio greater than 0.5, and in one embodiment that is no greater than 1.0. A higher upper-second-tier 20U* that is above the lower upper-second-tier comprises silicon dioxide having a silicon-to-oxygen atomic ratio less than or equal to 0.5. Such higher upper-second-tier 20U* may be stoichiometric (i.e., silicon-to-oxygen atomic ratio of 0.5) or may be non-stoichiometric (i.e., silicon-to-oxygen atomic ratio less 0.5).

In one embodiment, the upper of lower-second-tiers 20L* comprises the non-stoichiometric silicon dioxide and in one such embodiment is uppermost lowest-second-tier 20LU. Such is exemplified in the figures by light stippling in material 24 that comprises the non-stoichiometric silicon dioxide having a silicon-to-oxygen atomic ratio greater than 0.5 in comparison to material 24 that comprises silicon dioxide having a silicon-to-oxygen atomic ratio less than or equal to 0.5. Regardless, in one embodiment, multiple upper lower-second-tiers 20L* comprise the non-stoichiometric silicon dioxide (e.g., one or more tiers 20L below upper lower-second-tier 20LU [not show] and that may or may not include upper lower-second-tier 20LU). In one embodiment, the lower of upper-second-tiers 20U* comprises the non-stoichiometric silicon dioxide and in one such embodiment is lowest upper-second-tier 20UL. Regardless, in one embodiment, multiple upper-second-tiers lower 20U comprise the non-stoichiometric silicon dioxide (e.g., one or more tiers 20U* above lower upper-second-tier 20UL [not show] and that may or may not include lower upper-second-tier 20UL). In one embodiment, each of the upper of lower-second-tiers 20LU* and the lower of upper-second-tiers 20U* comprises the non-stoichiometric silicon dioxide (and that may include any of the immediately-above-stated attributes).

Figure 5:
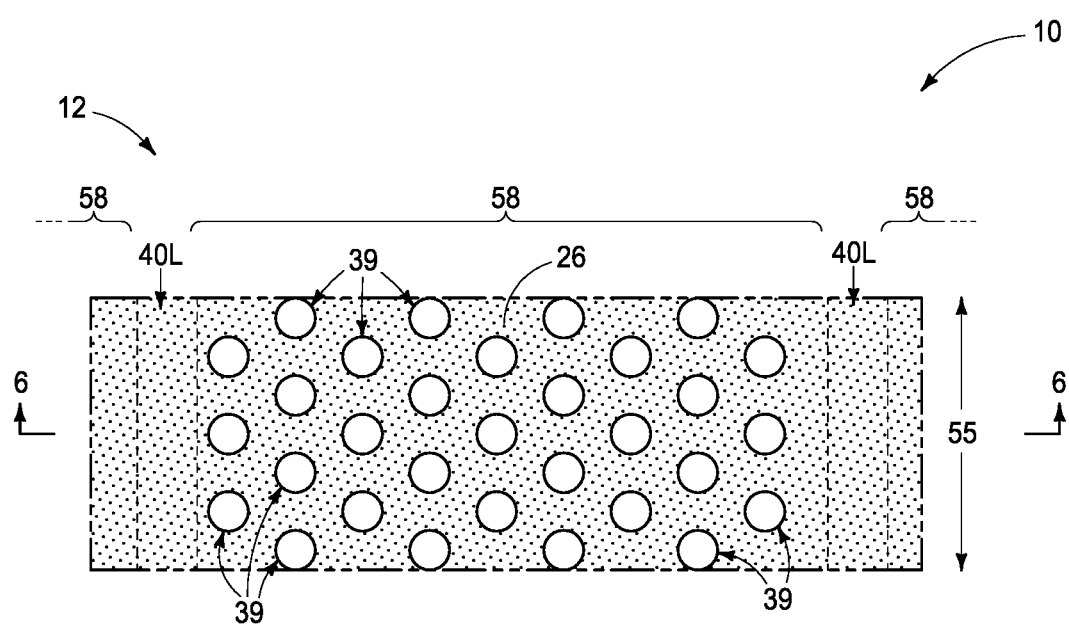
Figure 6:
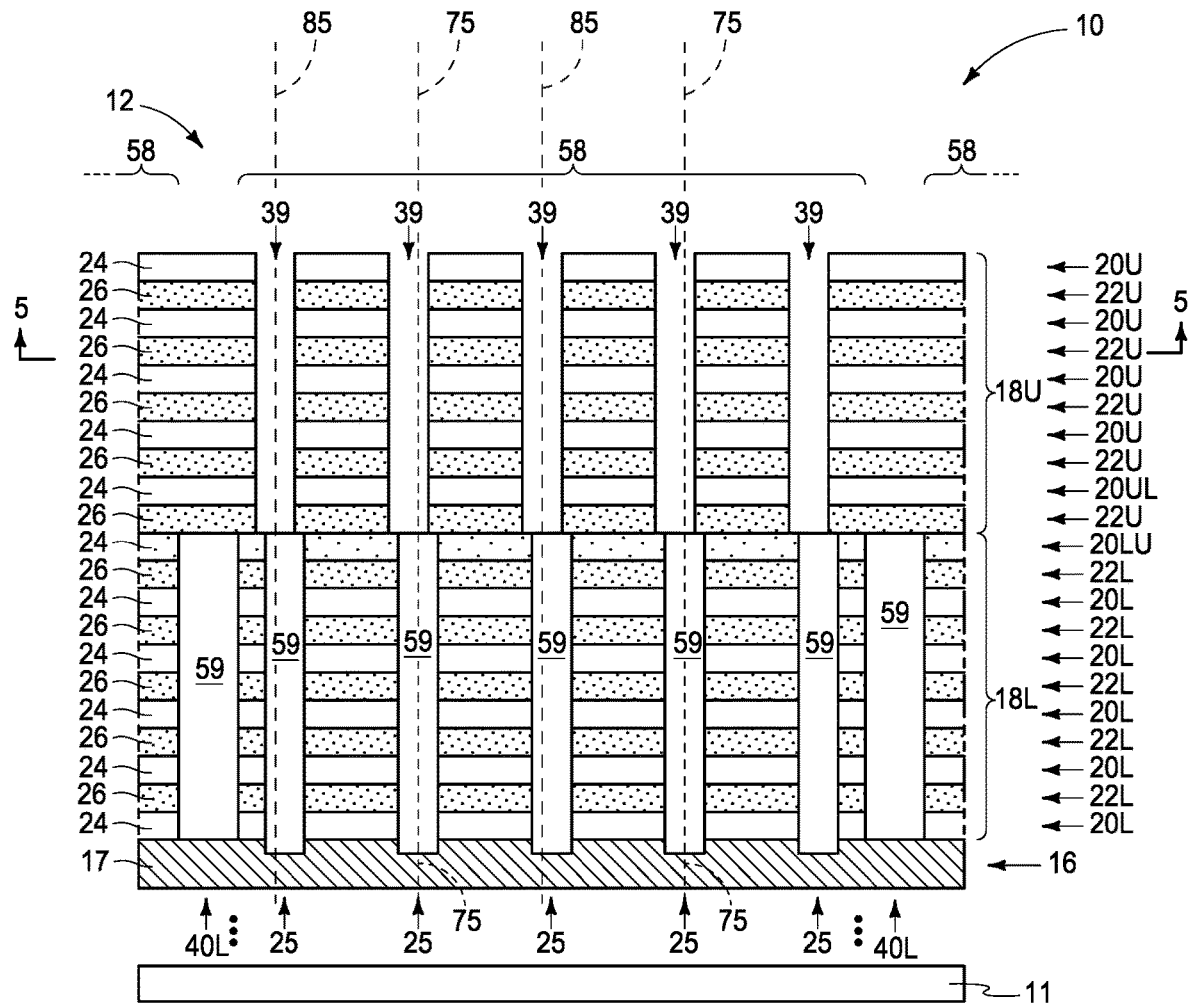
Figure 7:
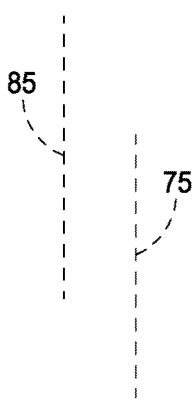

Upper channel openings are etched through upper-first-tiers 22U* and upper-second-tiers 20U* to stop on the upper lower-second-tier or the lower upper-second-tier that comprises the non-stoichiometric silicon dioxide. FIGS. 5 and 6 show upper channel openings 39 as having been etched through upper-first-tiers 22U* and upper-second-tiers 20U* to stop on upper lower-second-tier 20LU (i.e., atop or within) which in this example comprises the non-stoichiometric silicon dioxide having the silicon-to-oxygen atomic ratio greater than 0.5. In one such embodiment and as shown, the etching of upper channel openings 39 to the stop (i.e., the stopping of the etching using the non-stoichiometric silicon dioxide of tier 20LU as an etch stop) exposes sacrificial material 59. In one embodiment and as shown, and as may be best perceived with reference to FIG. 7, individual upper channel openings 39 are formed to have an average longitudinal axis 85 that is laterally offset relative to lower-portion average longitudinal axis 75 in a vertical cross-section (e.g. that of FIG. 6) where upper channel openings 39 and lower channel openings 25 join. Alternately, average longitudinal axis 85 may be angled (at other than the straight angle) relative to average longitudinal axis 75.

Figure 8:
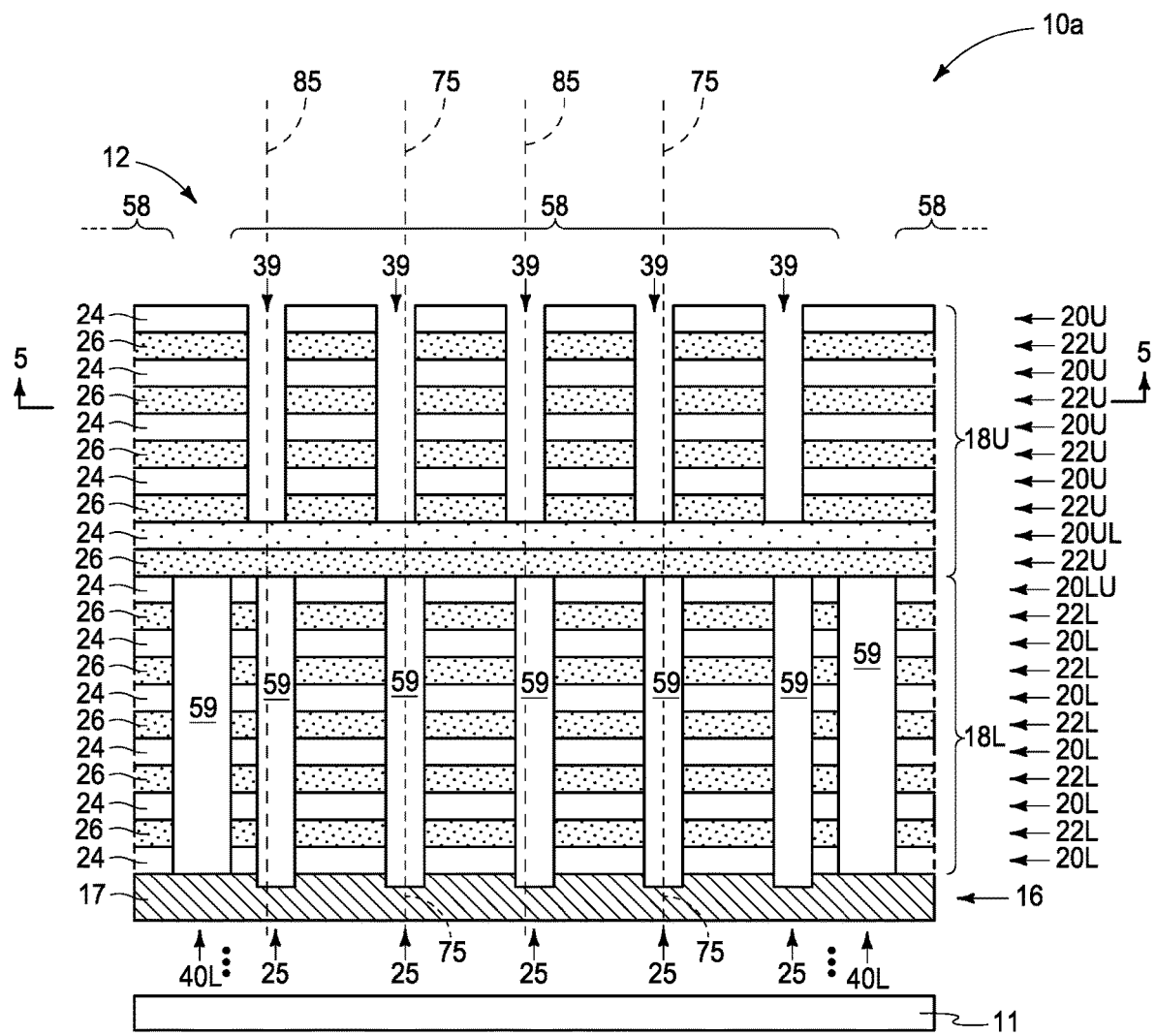
FIGS. 8 and 9 show an alternate example method and/or structural embodiment of the invention.
Figure 9:
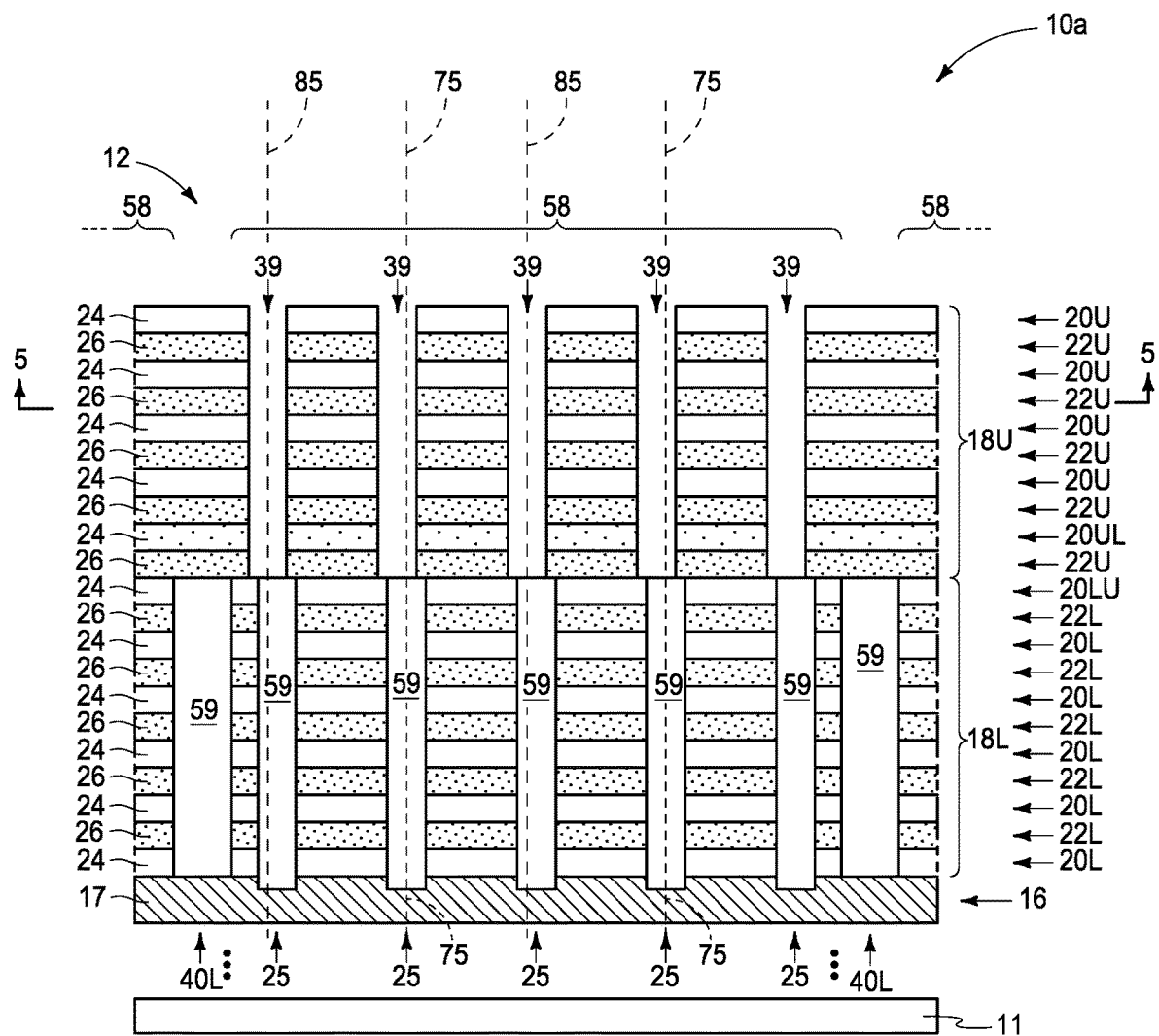

An alternate example is shown in FIGS. 8 and 9 with respect to a construction 10a. Like numerals from the above-described embodiments have been used where appropriate, with some construction differences being indicated with the suffix "a" or with different numerals. FIG. 8 shows etching upper channel openings 39 through upper-first-tiers 22U* and upper-second-tiers 20U* to stop on lower upper-second-tier 20UL (i.e., atop or within) which in this example comprises the non-stoichiometric silicon dioxide having the silicon-to-oxygen atomic ratio greater than 0.5. Thereby, the etching of upper channel openings 39 to the stop (i.e., the stopping of the etching using the non-stoichiometric silicon dioxide of tier 20UL as an etch stop) does not expose sacrificial material 59. FIG. 9 shows subsequent etching through lower upper-second-tier 20UL (and through upper-first-tier 22U immediately there-below) to expose sacrificial material 59. Any other attribute(s) or aspect(s) as shown and/or described herein with respect to other embodiments may be used.

Figure 10:
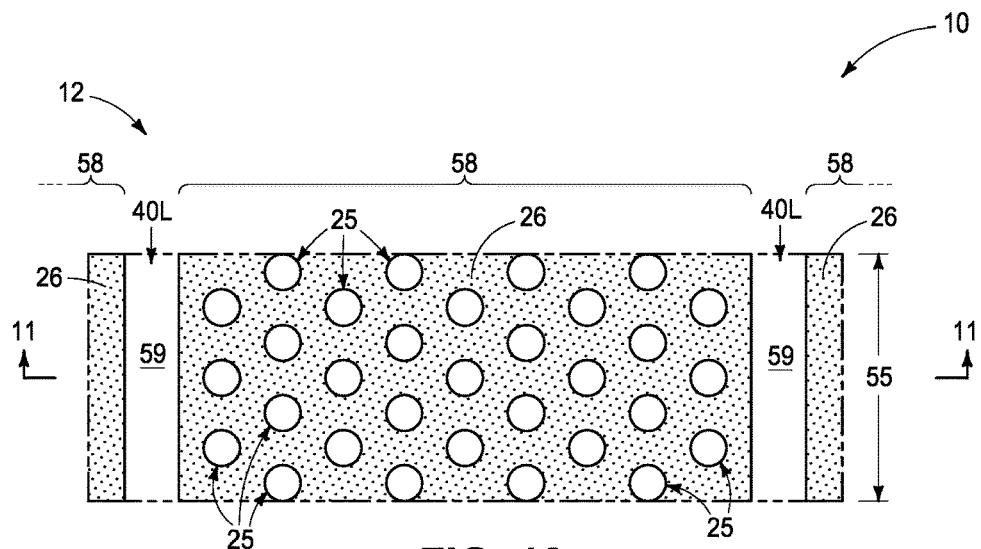
Figure 11:
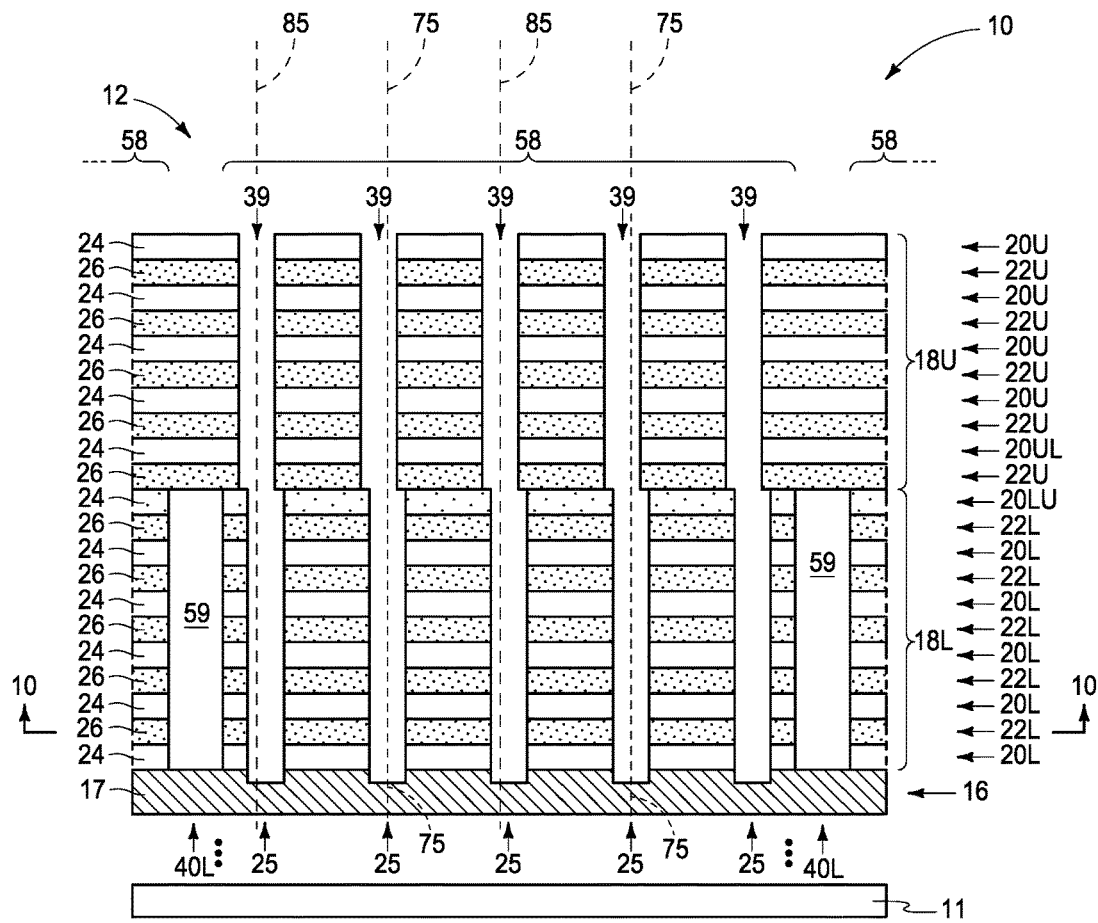
Figure 12:
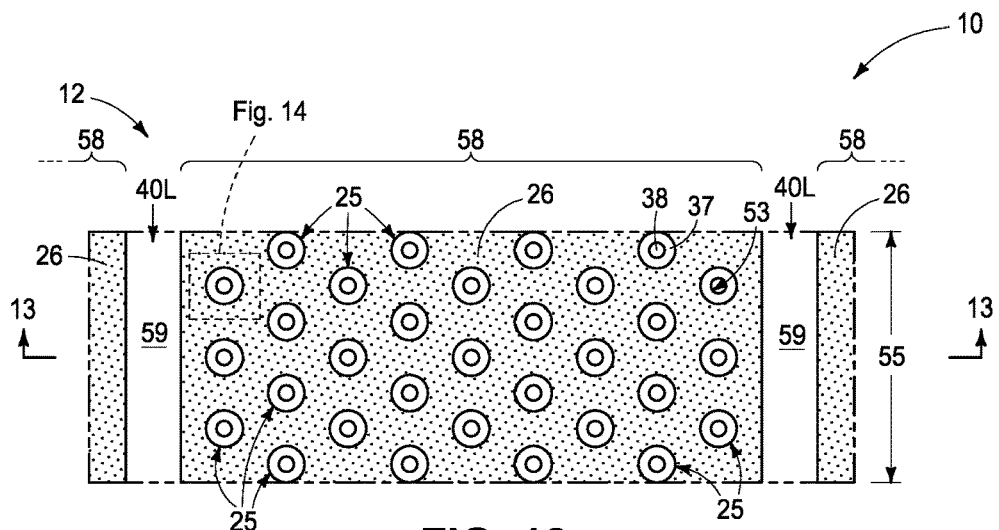
Figure 13:
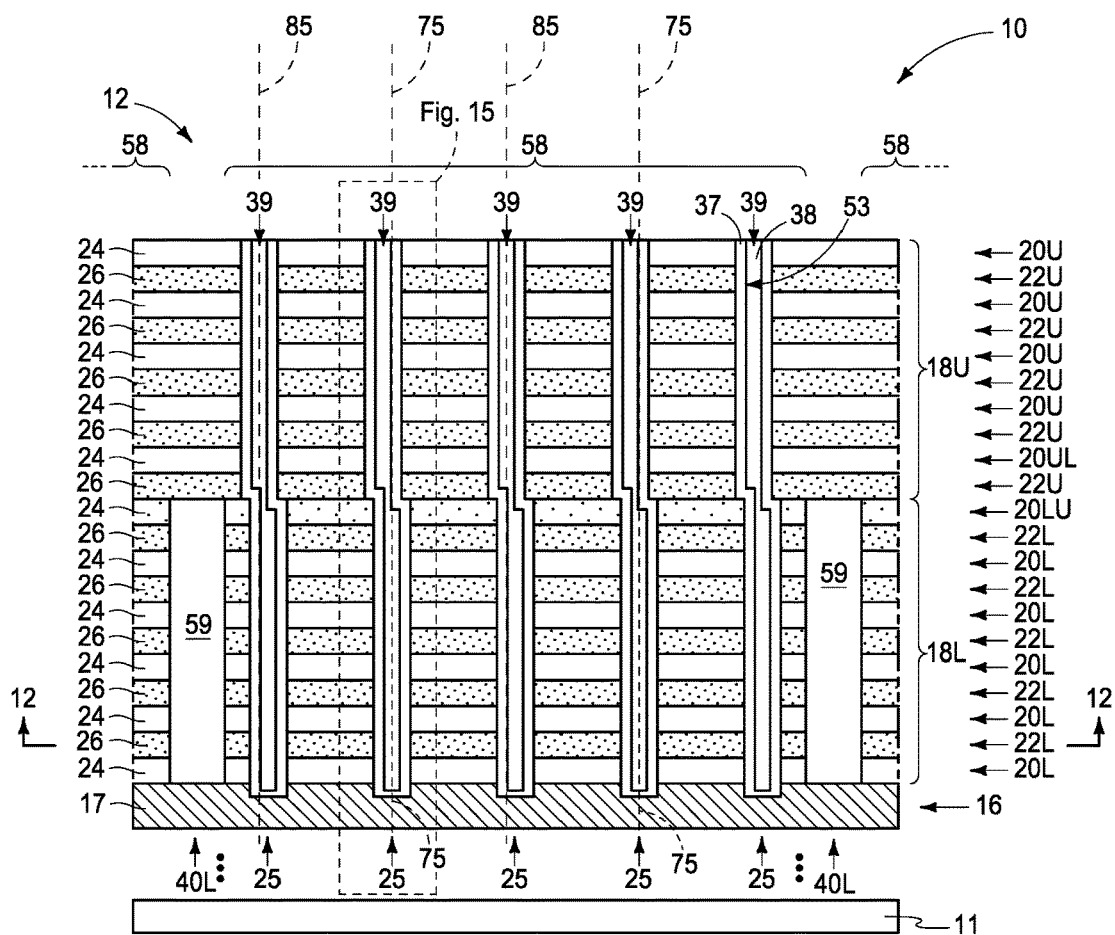
Figure 14:
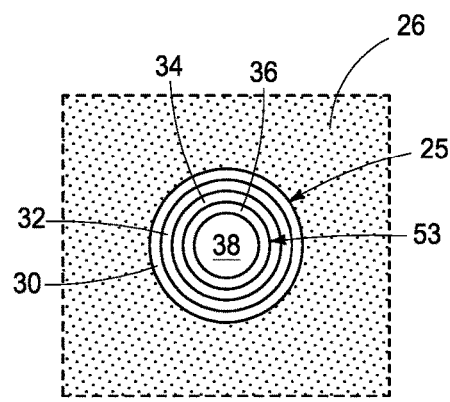
Figure 15:
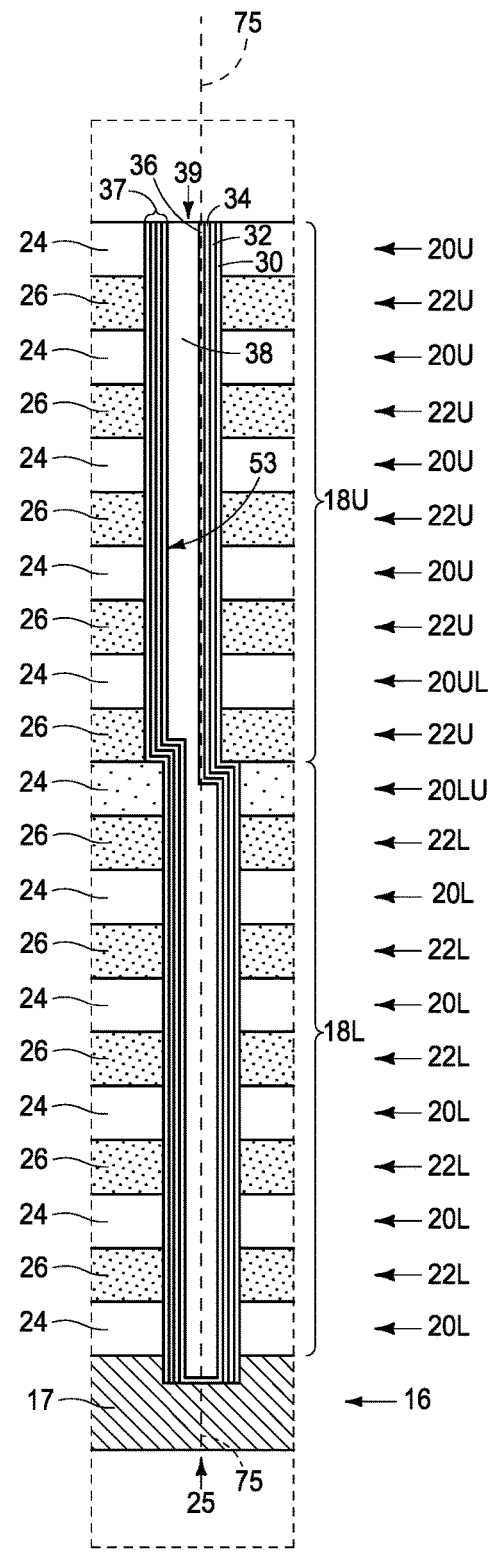

Referring to FIGS. 10 and 11, back to construction 10, sacrificial material 59 (i.e., at least some) has been removed (e.g., by etching) from individual lower channel openings 25 through upper channel openings 39. Where, for example, materials 70, 71, and 72 are present, some of material(s) 70 and/or 71 may remain (not shown) to facilitate formation of transistor material (described below).

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 12-15 show one embodiment wherein charge-blocking material 30, storage material 32, and charge-passage material 34 have been formed in individual upper channel openings 39 and lower channel openings 25 elevationally along insulative tiers 20* and conductive tiers 22*.

Transistor materials 30, 32, and 34 (e.g., memory-cell materials) may be formed by, for example, deposition of respective thin layers thereof over upper stack 18U and within individual openings 39 and 25 followed by planarizing such back at least to a top surface of upper stack 18U.

Channel material 36 has also been formed in channel openings 39/25 elevationally along insulative tiers 20U*/20L* and conductive tiers 22U*/22L*, thus comprising individual operative channel-material strings 53 in channel openings 39/25. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 11 and 12 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of lower channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 39/25 are shown as comprising a radially-central solid dielectric material 38 (e.g., spin-on-dielectric, silicon dioxide, and/or silicon nitride). Alternately, and by way of example only, the radially-central portion within channel openings 39/25 may include void space(s) (not shown) and/or be devoid of solid material (not shown).

Figure 16:
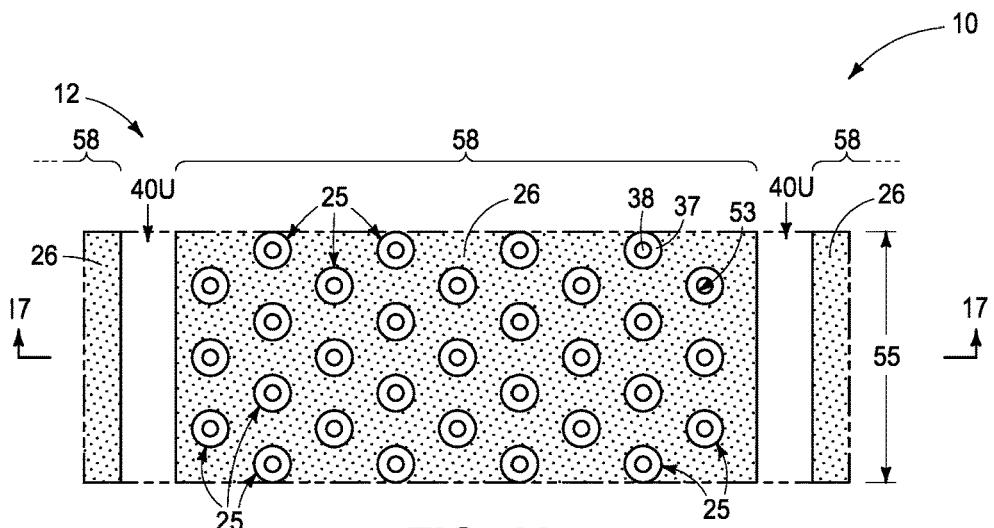
Figure 17:
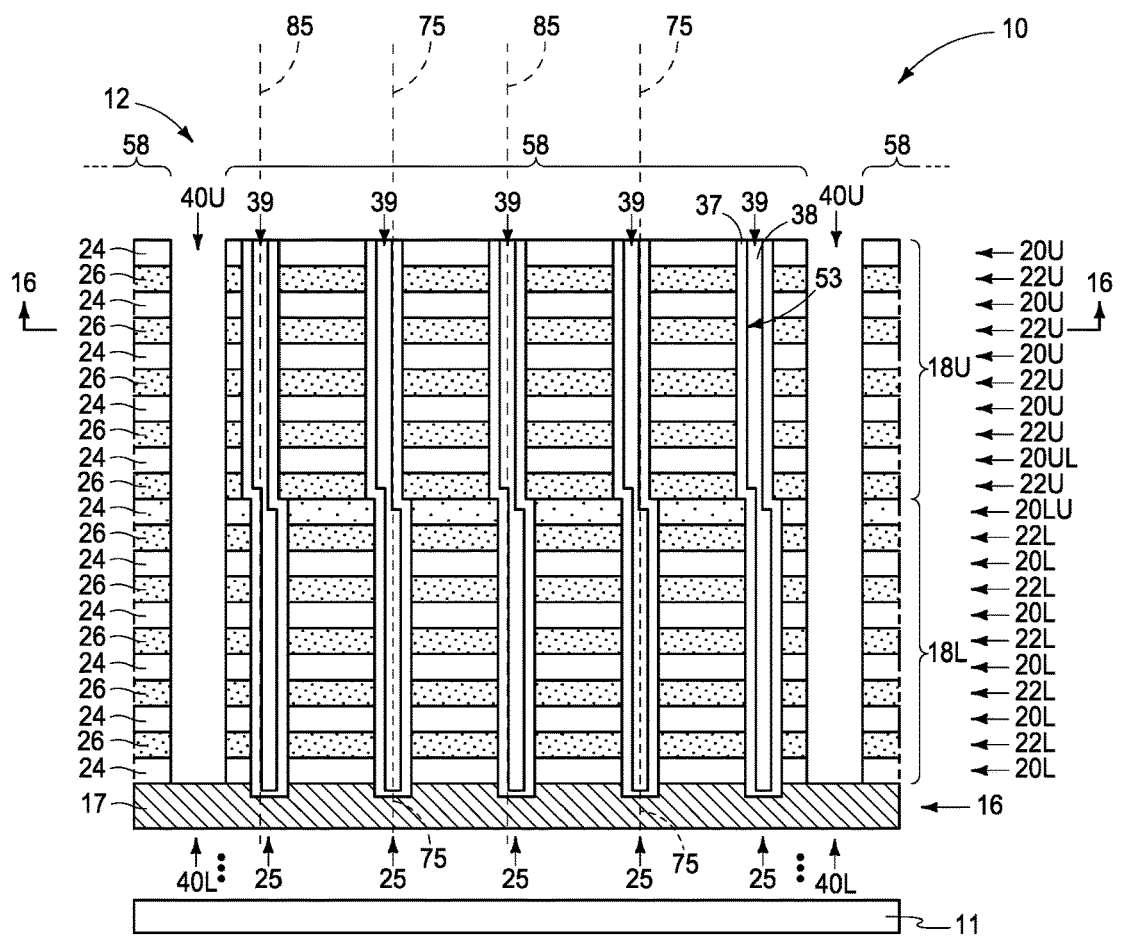

Referring to FIGS. 16 and 17, horizontally-elongated upper trenches 40U have been formed to lower trenches 40L and sacrificial material 59 (not shown) has then been removed therefrom (e.g., by selective etching).

Figure 18:
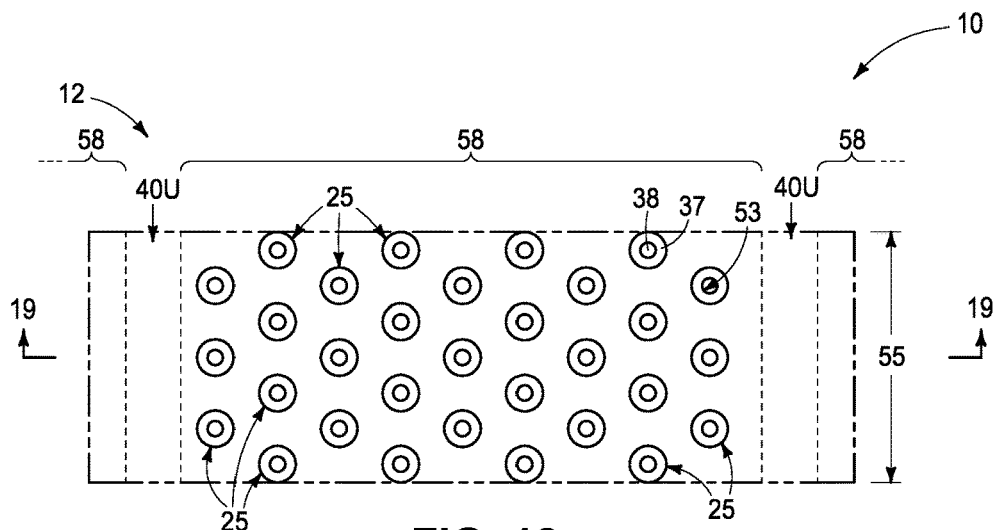
Figure 19:
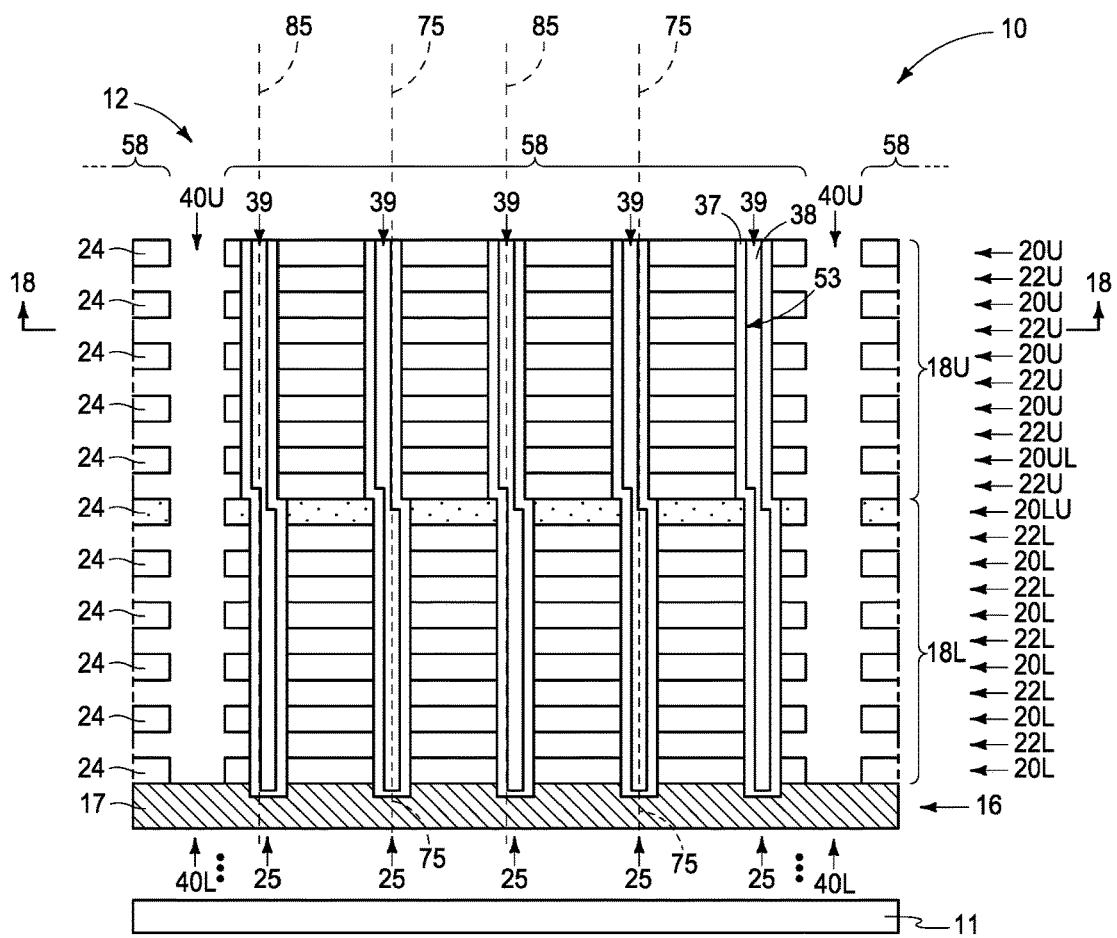

Referring to FIGS. 18 and 19, first-tier material 26 (not shown) in first tiers 22* has been isotropically etched through trenches 40U/40L selectively relative to second-tier material 24 in second tiers 20* (e.g., using liquid or vapor $H_3PO_4$ as a primary etchant where material 26 comprises silicon nitride and exposed other materials comprise one or more oxides or polysilicon).

Referring to FIGS. 20-26, conducting material 48 has been deposited into trenches 40U/40L to fill volume in conductive tiers 22* the result of removing material 26. Such has thereafter been removed from trenches 40U/40L, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 24 and some with dashed outlines in FIGS. 20-23 and 25, with transistors and/or memory cells 56 being essentially ring-like or annular in the depicted example. Alternately, transistors and/or memory cells 56 may not be completely encircling relative to individual channel openings 39/25 such that each channel opening 39/25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 24) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22U/22L is formed after forming channel openings 39/25 and/or trenches 40U/40L. Alternately, the conducting material of the conductive tiers may be formed before forming channel openings 39/25 and/or trenches 40U/40L (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40U/40L and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Figure 20:
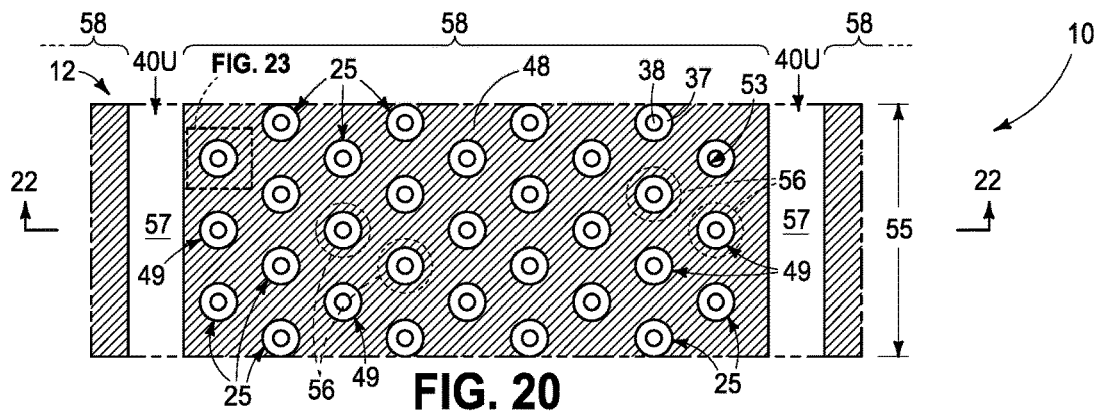
Figure 21:
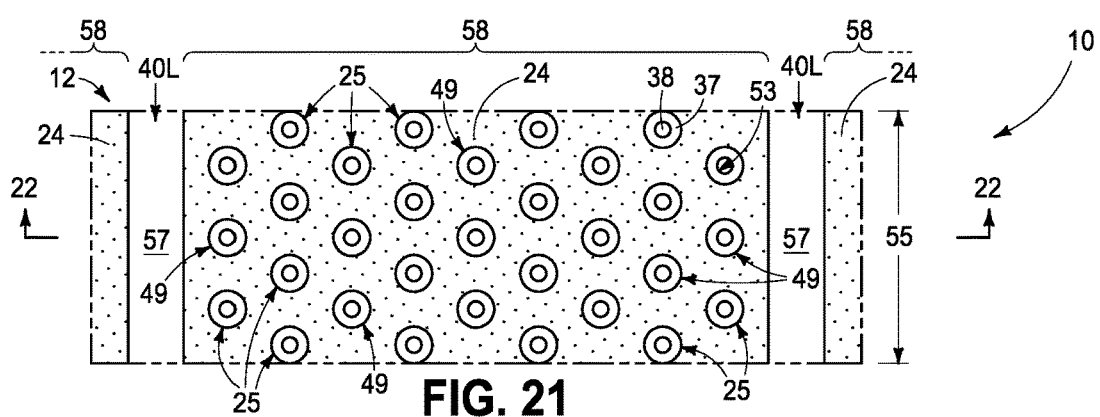
Figure 22:
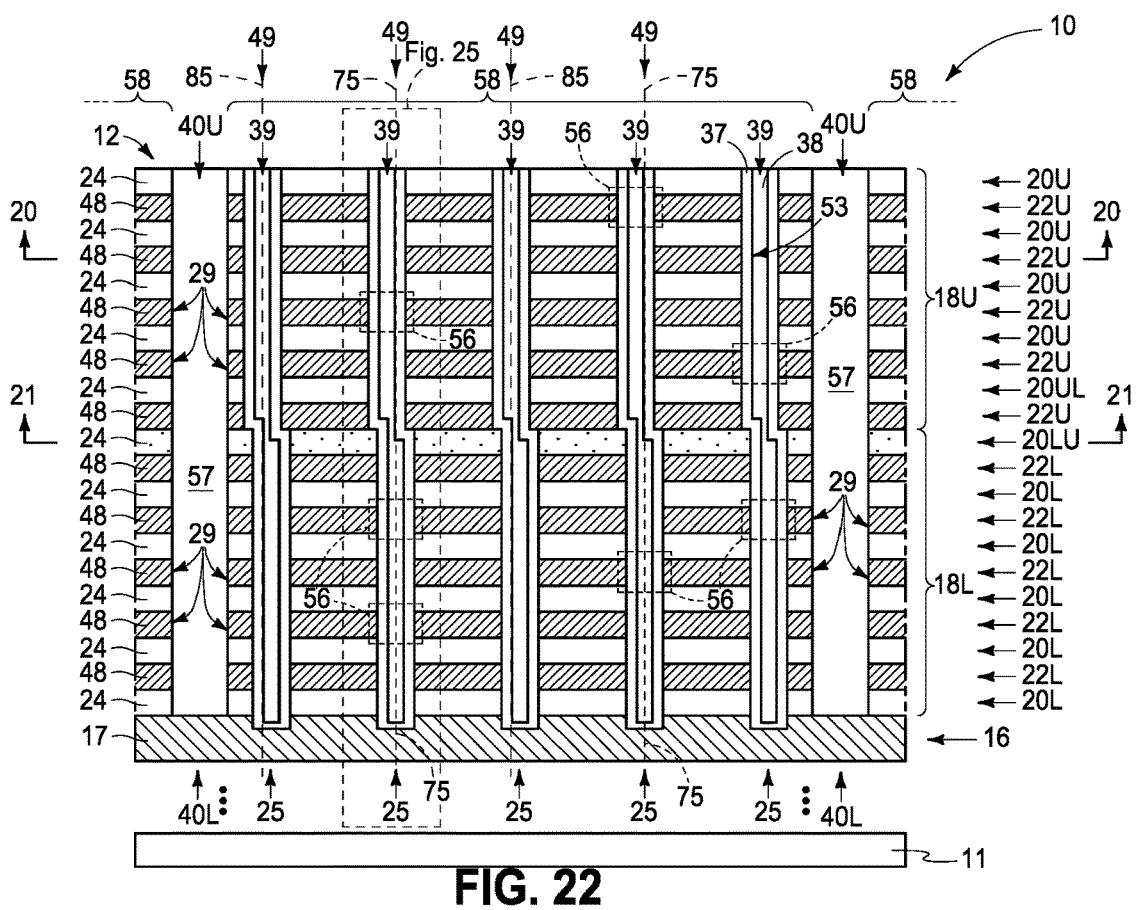
Figure 23:
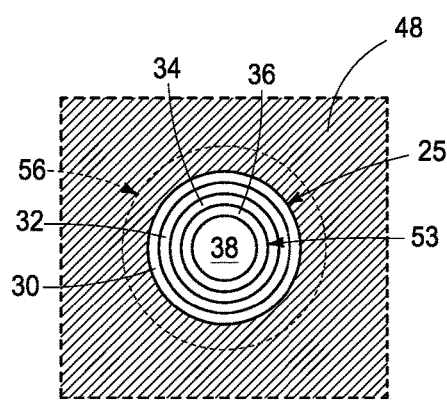
Figure 24:
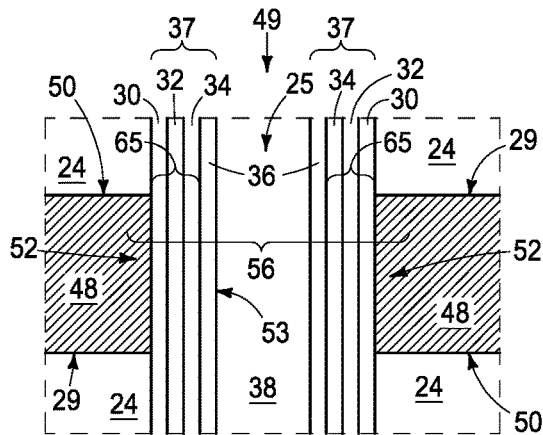
Figure 25:
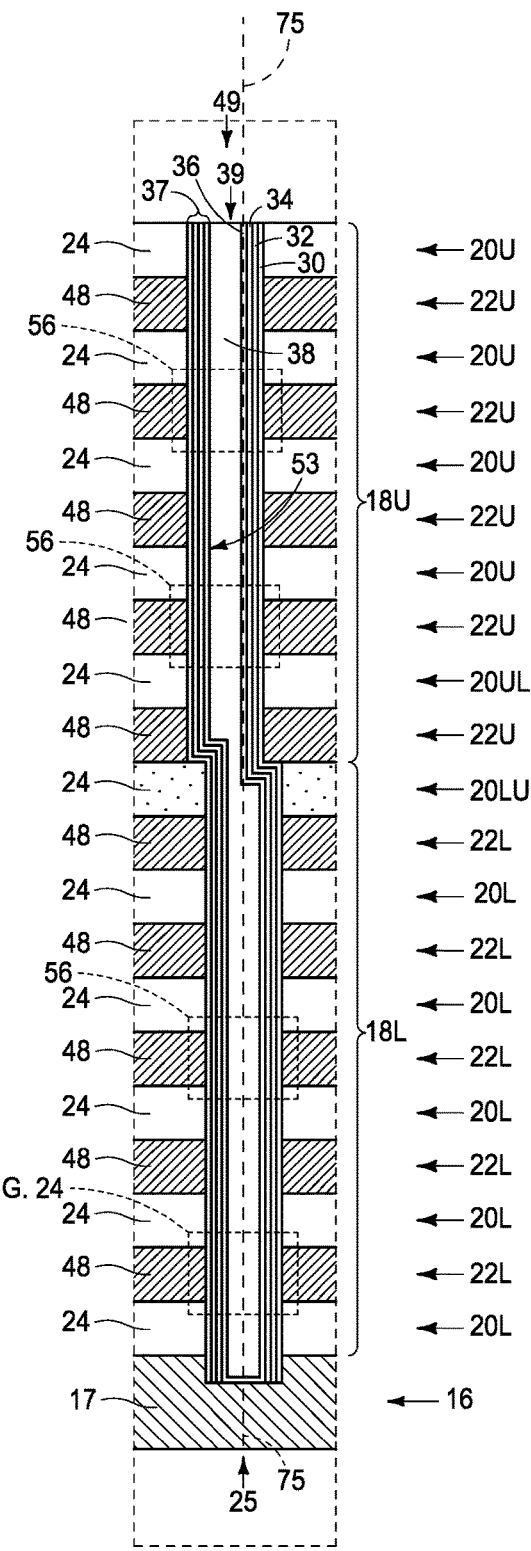
Figure 26:
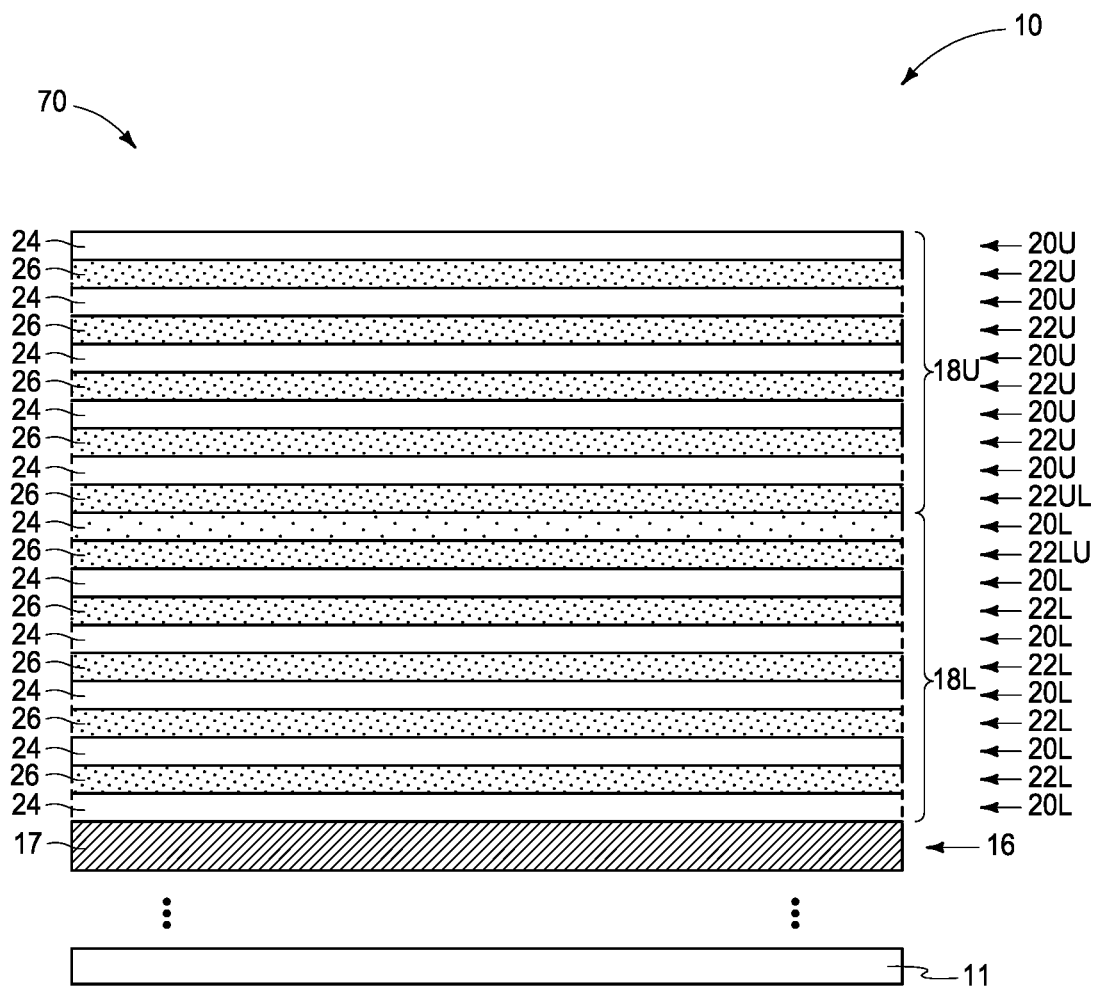

In some embodiments, construction 10 may be considered as comprising a first region (e.g., as shown by FIGS. 20-22) and a second region 70 aside the first region (e.g., as shown in FIG. 26). Second region 70 may be laterally-contacting the first region (not shown) or may be laterally-spaced from the first region (e.g., closely laterally there-adjacent but not touching, or laterally-far there-from and not touching). Second region 70 may be within one or more of the memory blocks (not shown). In some embodiments, construction 10 may be considered as comprising a first vertical stack (e.g., stack 18* in FIGS. 20-22) and a second vertical stack (e.g., stack 18* in second region 70), with the second stack comprising an upper portion 18U and a lower portion 18L.

Any other attribute(s) or aspect(s) as shown and/or described herein with respect to other embodiments may be used in the embodiments shown and described with reference to the above embodiments.

Alternate embodiment constructions may result from method embodiments described above, or otherwise. Regardless, embodiments of the invention encompass integrated circuitry comprising a memory array independent of method of manufacture. Nevertheless, such integrated circuitry and memory array may have any of the attributes as described herein in method embodiments. Likewise, the above-described method embodiments may incorporate, form, and/or have any of the attributes described with respect to device embodiments.

In one embodiment, integrated circuitry (e.g., 10) comprising a memory array (e.g., 12) comprising strings (e.g., 49) of memory cells (e.g., 56) comprises an upper stack (e.g., 18U) directly above a lower stack (e.g., 18L). The lower stack comprises vertically-alternating lower-conductive-tiers (e.g., 22L*) and lower-insulative-tiers (e.g., 20L*). The upper stack comprises vertically-alternating upper-conductive-tiers (e.g., 22U*) and upper-insulative-tiers (e.g., 20U*). An upper of the lower-insulative-tiers or a lower of the upper-insulative-tiers comprises non-stoichiometric silicon dioxide having a silicon-to-oxygen atomic ratio greater than 0.5. A higher of the upper-insulative-tiers that is above said lower upper-insulative-tier comprises silicon dioxide having a silicon-to-oxygen atomic ratio less than or equal to 0.5. Channel-material strings (e.g., 53) of memory cells (e.g., 56) extend through the upper stack and the lower stack including through the non-stoichiometric silicon dioxide. Any other attribute(s) or aspect(s) as shown and/or described herein with respect to other embodiments may be used.

In one embodiment, integrated circuitry (e.g., 10) comprising a memory array (e.g., 12) comprising strings (e.g., 49) of memory cells (e.g., 56) comprises laterally-spaced memory blocks (e.g., 58) individually comprising a first vertical stack (e.g., 18* in FIG. 22) comprising alternating insulative tiers (e.g., 20*) and conductive tiers (e.g., 22*). Strings (e.g., 49) of memory cells (e.g., 56) comprising channel-material strings (e.g., 53) extend through the insulative tiers and the conductive tiers. The conductive tiers individually comprise a horizontally-elongated conductive line (e.g., 29). A second vertical stack (e.g., 18* in FIG. 26) is aside the first vertical stack. The second vertical stack comprises an upper portion (e.g., 18U) and a lower portion (e.g., 18L). The upper portion comprises alternating upper-first-insulating-tiers (e.g., 22U*) and upper-second-insulating-tiers (e.g., 20U*) of different composition relative one another. The lower portion comprises lower-first-insulating-tiers (e.g., 22L*) and lower-second-insulating-tiers (e.g., 20L*) of different composition relative one another. An upper of the lower-second-insulating-tiers or a lower of the upper-second-insulating-tiers comprises non-stoichiometric silicon dioxide having a silicon-to-oxygen atomic ratio greater than 0.5. A higher of the upper-second-insulating-tiers that is above said lower upper-second-insulating-tier comprises silicon dioxide having a silicon-to-oxygen atomic ratio less than or equal to 0.5. Any other attribute(s) or aspect(s) as shown and/or described herein with respect to other embodiments may be used.

The above processing(s) or construction(s) may be considered as being relative to an array of components formed as or within two stacks or two decks of such components above or as part of an underlying base substrate (albeit, the two stacks/decks may each have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming an upper stack directly above a lower stack. The lower stack comprises vertically-alternating lower-first-tiers and lower-second-tiers. The upper stack comprises vertically-alternating upper-first-tiers and upper-second-tiers, Lower channel openings extend through the lower-first-tiers and the lower-second-tiers. The lower channel openings have sacrificial material therein. An upper of the lower-second-tiers or a lower of the upper-second-tiers comprises non-stoichiometric silicon dioxide that has a silicon-to-oxygen atomic ratio greater than 0.5. A higher of the upper-second-tiers that is above said lower upper-second-tier comprises silicon dioxide that has a silicon-to-oxygen atomic ratio less than or equal to 0.5. Upper channel openings are etched through the upper-first-tiers and the upper-second-tiers to stop on said upper lower-second-tier or said lower upper-second-tier. After the stop, the sacrificial material is removed from the lower channel openings and channel-material strings are formed in the upper and lower channel openings.

In some embodiments, integrated circuitry comprising a memory array comprising strings of memory cells comprises an upper stack directly above a lower stack. The lower stack comprises vertically-alternating lower-conductive-tiers and lower-insulative-tiers. The upper stack comprises vertically-alternating upper-conductive-tiers and upper-insulative-tiers. An upper of the lower-insulative-tiers or a lower of the upper-insulative-tiers comprises non-stoichiometric silicon dioxide that has a silicon-to-oxygen atomic ratio greater than 0.5. A higher of the upper-insulative-tiers that is above said lower upper-insulative-tier comprises silicon dioxide that has a silicon-to-oxygen atomic ratio less than or equal to 0.5. Channel-material strings of memory cells extend through the upper stack and the lower stack including through the non-stoichiometric silicon dioxide.

In some embodiments, integrated circuitry comprising a memory array comprising strings of memory cells comprises laterally-spaced memory blocks individually comprising a first vertical stack comprising alternating insulative tiers and conductive tiers. Strings of memory cells comprise channel-material strings that extend through the insulative tiers and the conductive tiers. The conductive tiers individually comprise a horizontally-elongated conductive line. A second vertical stack is aside the first vertical stack. The second vertical stack comprises an upper portion and a lower portion. The upper portion comprises alternating upper-first-insulating-tiers and upper-second-insulating-tiers of different composition relative one another. The lower portion comprises lower-first-insulating-tiers and lower-second-insulating-tiers of different composition relative one another. An upper of the lower-second-insulating-tiers or a lower of the upper-second-insulating-tiers comprises non-stoichiometric silicon dioxide that has a silicon-to-oxygen atomic ratio greater than 0.5. A higher of the upper-second-insulating-tiers that is above said lower upper-second-insulating-tier comprises silicon dioxide that has a silicon-to-oxygen atomic ratio less than or equal to 0.5.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Integrated circuitry comprising a memory array comprising strings of memory cells, comprising:
   an upper stack directly above a lower stack, the lower stack comprising vertically-alternating lower-conductive-tiers and lower-insulative-tiers, the upper stack comprising vertically-alternating upper-conductive-tiers and upper-insulative-tiers;
   an upper tier of the lower-insulative-tiers or a lower tier of the upper-insulative-tiers comprising non-stoichiometric silicon dioxide having a silicon-to-oxygen atomic ratio greater than 0.5, a higher tier of the upper-insulative-tiers that is above said lower upper-insulative-tier comprising silicon dioxide having a silicon-to-oxygen atomic ratio less than or equal to 0.5; and
   channel-material strings of memory cells extending through the upper stack and the lower stack including through the non-stoichiometric silicon dioxide.

2. The integrated circuitry of claim 1 wherein the non-stoichiometric silicon dioxide has silicon-to-oxygen atomic ratio no greater than 1.0.

3. The integrated circuitry of claim 1 wherein the upper tier of the lower-insulative-tiers comprises the non-stoichiometric silicon dioxide.

4. The integrated circuitry of claim 3 wherein the upper tier of the lower-insulative-tiers is the uppermost tier of the lower-insulative-tiers.

5. The integrated circuitry of claim 3 wherein multiple of the upper lower-insulative-tiers comprise the non-stoichiometric silicon dioxide.

6. The integrated circuitry of claim 1 wherein the lower tier of the upper-insulative-tiers comprises the non-stoichiometric silicon dioxide.

7. The integrated circuitry of claim 6 wherein the lower tier of the upper-insulative-tiers is the lowest tier of the upper-insulative-tiers.

8. The integrated circuitry of claim 6 wherein multiple of the lower upper-insulative-tiers comprise the non-stoichiometric silicon dioxide.

9. The integrated circuitry of claim 1 wherein each of the upper tiers of the lower-insulative-tiers and the lower tiers of the upper-insulative-tiers comprises the non-stoichiometric silicon dioxide.

10. Integrated circuitry comprising a memory array comprising strings of memory cells, comprising:
    laterally-spaced memory blocks individually comprising a first vertical stack comprising alternating insulative tiers and conductive tiers, strings of memory cells comprising channel-material strings that extend through the insulative tiers and the conductive tiers, the conductive tiers individually comprising a horizontally-elongated conductive line;
    a second vertical stack aside the first vertical stack, the second vertical stack comprising an upper portion and a lower portion, the upper portion comprising alternating upper-first-insulating-tiers and upper-second-insulating-tiers of different composition relative one another, the lower portion comprising lower-first-insulating-tiers and lower-second-insulating-tiers of different composition relative one another; and
    an upper tier of the lower-second-insulating-tiers or a lower tier of the upper-second-insulating-tiers comprising non-stoichiometric silicon dioxide having a silicon-to-oxygen atomic ratio greater than 0.5, a higher tier of the upper-second-insulating-tiers that is above said lower upper-second-insulating-tier comprising silicon dioxide having a silicon-to-oxygen atomic ratio less than or equal to 0.5.

11. The integrated circuitry of claim 10 wherein the non-stoichiometric silicon dioxide has silicon-to-oxygen atomic ratio no greater than 1.0.

12. The integrated circuitry of claim 10 wherein the upper tier of the lower-second-insulating-tiers comprises the non-stoichiometric silicon dioxide.

13. The integrated circuitry of claim 12 wherein the upper tier of the lower-second-insulating-tiers is the uppermost tier of the lower-second-insulating-tiers.

14. The integrated circuitry of claim 12 wherein multiple of the upper lower-second-insulating-tiers comprise the non-stoichiometric silicon dioxide.

15. The integrated circuitry of claim 10 wherein the lower tier of the upper-second-insulating-tiers comprises the non-stoichiometric silicon dioxide.

16. The integrated circuitry of claim 15 wherein the lower of the upper-second-insulating-tiers is the lowest tier of the upper-second-insulating-tiers.

17. The integrated circuitry of claim 15 wherein multiple of the lower upper-second-insulating-conductive-tiers comprise the non-stoichiometric silicon dioxide.

18. The integrated circuitry of claim 10 wherein each of the upper tiers of the lower-second-insulating-tiers and the lower tier of the upper-second-insulating-tiers comprises the non-stoichiometric silicon dioxide.

* * * * *